(12) United States Patent
Chiu et al.

(10) Patent No.: US 9,263,329 B2
(45) Date of Patent: Feb. 16, 2016

(54) METHODS OF CONNECTING A FIRST ELECTRONIC PACKAGE TO A SECOND ELECTRONIC PACKAGE

(71) Applicant: Intel Corporation, Santa Clara, CA (US)

(72) Inventors: Chia-Pin Chiu, Tempe, AZ (US); Kinya Ichikawa, Tsukuba (JP); Yoshihiro Tomita, Tsukuba (JP); Robert L. Sankman, Phoenix, AZ (US); Eric Li, Chandler, AZ (US)

(73) Assignee: Intel Corporation, Santa Clara, MN (US)

( * ) Notice: Subject to any disclaimer, the term of this patent is extended or adjusted under 35 U.S.C. 154(b) by 0 days.

(21) Appl. No.: 14/219,749

(22) Filed: Mar. 19, 2014

(65) Prior Publication Data

US 2015/0270169 A1 Sep. 24, 2015

(51) Int. Cl.
*H01L 21/00* (2006.01)
*H01L 21/4763* (2006.01)
(Continued)

(52) U.S. Cl.
CPC ........ *H01L 21/76885* (2013.01); *H01L 21/565* (2013.01); *H01L 21/7685* (2013.01); *H01L 24/03* (2013.01); *H01L 24/11* (2013.01); *H01L 24/81* (2013.01); *H01L 25/0657* (2013.01); *H01L 25/50* (2013.01); *H01L 2224/81801* (2013.01); *H01L 2225/06517* (2013.01); *H01L 2225/06548* (2013.01); *H01L 2225/06555* (2013.01); *H01L 2924/01029* (2013.01); *H01L 2924/06* (2013.01); *H01L 2924/381* (2013.01)

(58) Field of Classification Search
CPC .......... H01L 2924/01079; H01L 2924/01078; H01L 2924/14; H01L 2924/01029; H01L 2924/01013; H01L 21/76843; H01L 21/76838; H01L 21/76877; H01L 21/76895; H01L 21/76834; H01L 21/76885; H01L 21/565; H01L 21/7685; H01L 24/03; H01L 24/11; H01L 24/81; H01L 25/0657; H01L 25/50; H01L 2224/81801; H01L 2225/06517; H01L 2225/06548; H01L 2225/06555; H01L 2924/06; H01L 2924/381
See application file for complete search history.

(56) References Cited

U.S. PATENT DOCUMENTS 4,906,823 A * 3/1990 Kushima et al. ............... 228/245
6,295,730 B1 * 10/2001 Akram ............................ 29/843
(Continued)

OTHER PUBLICATIONS

Hu, Dyi-Chung, et al., "A PoP Structure to Support I/O over 1000", 2013 Electronic Components & Technology Conference, (2013), 412-416.
(Continued)

*Primary Examiner* — Michelle Mandala
(74) *Attorney, Agent, or Firm* — Schwegman Lundberg & Woessner, P.A.

(57) ABSTRACT

A method of fabricating an electronic package. The method includes filling a mold with an electric conductor to form a number of electrical interconnects within the mold. The mold includes openings that are filled with several electric conductors to form a number of electrical interconnects. The method of fabricating an electronic package further includes attaching the mold to a substrate such that the electrical interconnects engage electrical contacts on the substrate. The method of fabricating an electronic package may further include forming conductive pads on the electrical insulator that engage the electrical interconnects and attaching a die to the substrate such that the die is electrically connected to at least some of the electrical interconnects.

20 Claims, 9 Drawing Sheets

(51) Int. Cl.
*H01L 21/768* (2006.01)
*H01L 25/00* (2006.01)
*H01L 25/065* (2006.01)
*H01L 23/00* (2006.01)
*H01L 21/56* (2006.01)

(56) References Cited

U.S. PATENT DOCUMENTS

2007/0246441 A1* 10/2007 Kim et al. .................... 216/41
2009/0095518 A1* 4/2009 Matsushita et al. ........... 174/261

OTHER PUBLICATIONS

Kim, Sung Jin, et al., "Ultra-Thin and Ultra-high I/O Density Package-on-Package (3D Thin PoP) for High Bandwidth of Smart Systems", 2013 Electronic Components & Technology Conference, (2013), 406-411.

Mohammed, Ilyas, et al., "Package-on-Package with Very Fine Pitch Interconnects for High Bandwidth", 2013 Electronic Components & Technology Conference, (2013), 922-928.

* cited by examiner

METHODS OF CONNECTING A FIRST ELECTRONIC PACKAGE TO A SECOND ELECTRONIC PACKAGE

TECHNICAL FIELD

Embodiments described herein generally relate to methods of connecting a first electronic package to a second electronic package.

BACKGROUND

Package-on-package fabrication has been widely used to increase memory bandwidth in a variety of electronics applications (e.g., Smartphone technology). Current package-on-package technology has reached an upward limit as to the number of electronic interconnects (i.e., I/O ports). Therefore, various different technologies are under development in order to meet higher I/O requirements.

One type of technology provides a 3D/TSV solution. However, TSV technology is not very mature and 3D assembly is quite challenging in order to produce fine-pitch electrical interconnects for package-on-package fabrication. Other technologies are currently being developed to form more dense electrical interconnections between packages. These technologies include (i) using wire-bond technology; (ii) HCP (high copper pillar); and (iii) Cu—SnAg plated bumps. The development of each of these technologies is suffering from various design issues that make it difficult to fabricate an increased density of electrical interconnects between packages in package-on-package electronic systems.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Electronic systems that utilize package on package technology are currently limited by the amount of electrical interconnects between packages. Current package on package technology forms topside electrical interconnects on one of the packages by using solder balls. The use of solder balls limits the pitch of the electrical interconnects (i.e., I/O ports) to be greater than 400 um.

Embodiments relating to the methods of connecting a first electronic to a second electronic package described herein temporarily create electrical interconnects inside a mold. Once the electrical interconnects are formed inside the mold, the mold and the electrical interconnects are attached to the top side of a first package substrate in a batch mode. Additional manufacturing processes are then done to complete the first electronic package in order to prepare the first electronic package for attachment to a second electronic package in a package-on-package arrangement.

The use of a mold allows electrical interconnects to be formed with a smaller pitch (e.g., 200-300 um) when compared to existing package-on-package technology. As discussed above, current package on package technology forms top side interconnects using solder balls which limit the pitch to be greater than 400 um.

Figure 1:
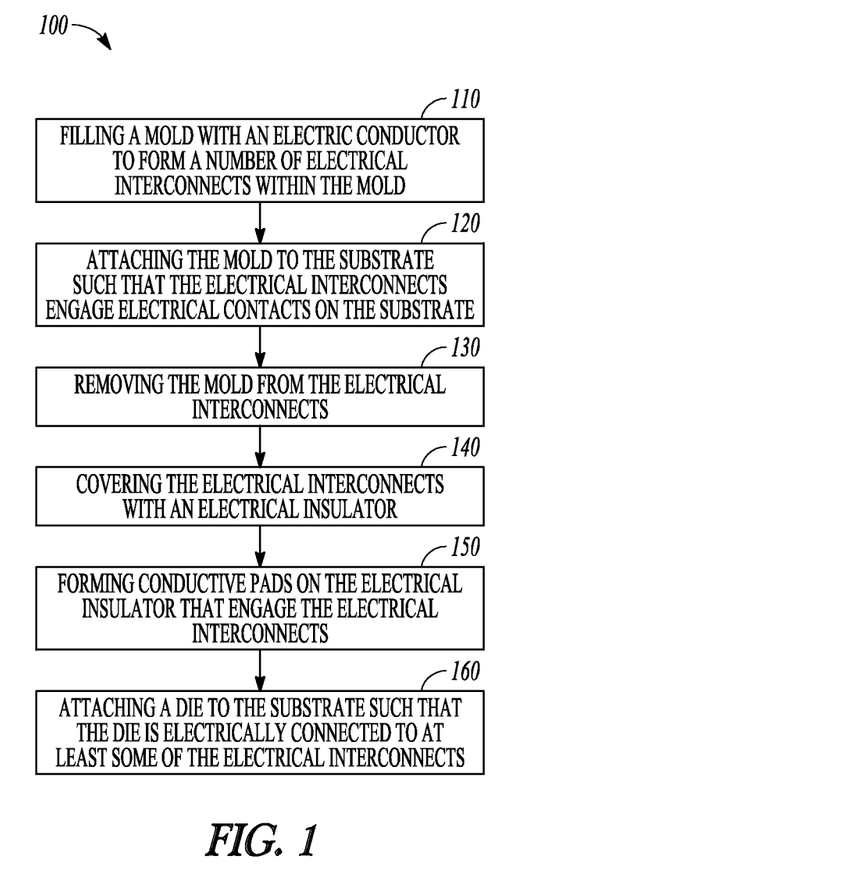
FIG. 1 illustrates a flow diagram of an example method of fabricating an electronic package.

FIG. 1 illustrates a method [100] of fabricating an electronic package 10 that includes [110] filling a mold 11 with an electric conductor to form a number of electrical interconnects 12 within the mold 11.

Figure 2:
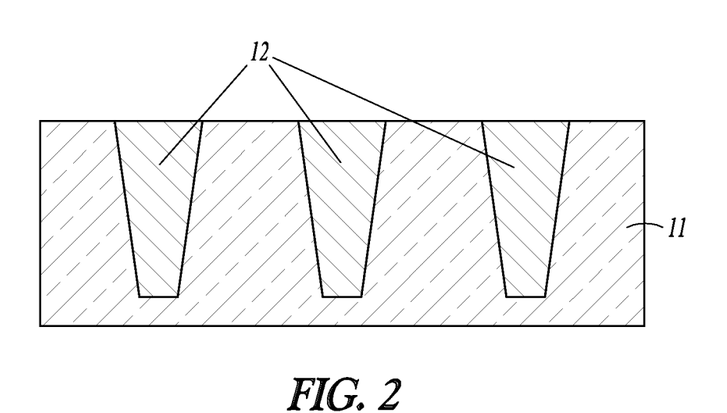
FIG. 2 is a side view of an example mold that may be used in the method shown in FIG. 1.

FIG. 2 is a side view of an example mold 11 that may be used in the method shown in FIG. 1. The mold 11 includes openings that are filled with several electric conductors to form a number of electrical interconnects 12.

Figure 3:
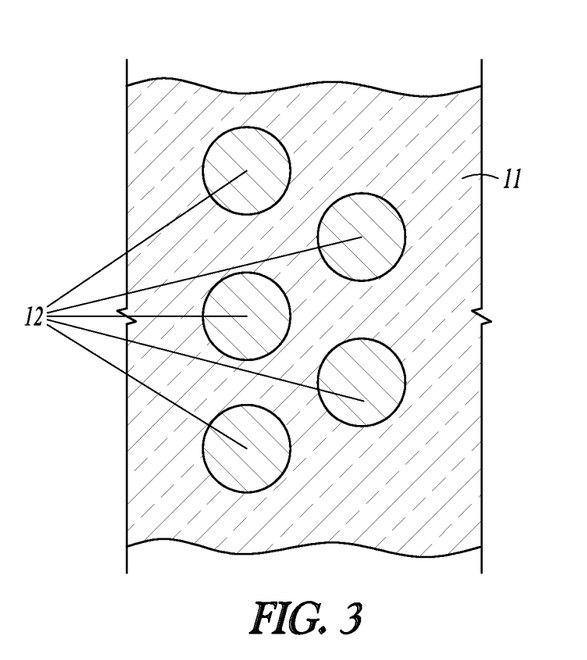
FIG. 3 is a top view of the mold shown in FIG. 2.

FIG. 3 is a top view of the mold 11 shown in FIG. 2. The use of the mold 11 allows the electrical interconnects 12 to be formed with a smaller pitch (e.g., 200-300 um) when compared to existing package-on-package technology. The number, arrangement and/or pattern of the openings in the mold 11 may vary depending on the overall design of the electronic package 10.

Figure 4:
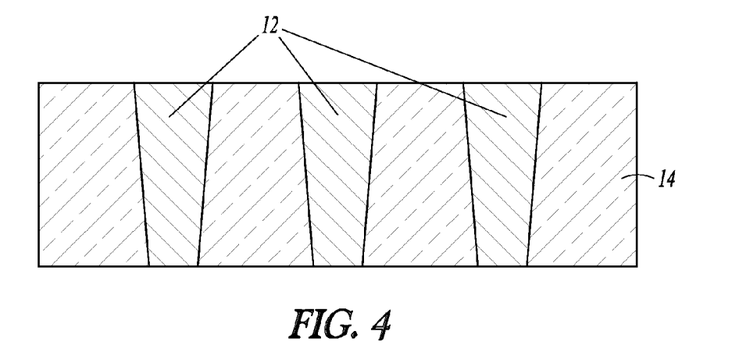
FIG. 4 is a side view of another example mold that may be used in the method shown in FIG. 1.

In the example mold 11 shown in FIGS. 2 and 3, the openings in the mold 11 do not extend all of the way through the mold 11. FIG. 4 is a side view of another example mold 14 that may be used in the method shown in FIG. 1. The mold 14 includes openings for several electric conductors that form a number of electrical interconnects 12. In the example mold 14 shown in FIG. 4, the openings in the mold 14 extend from one side of the mold 14 to an opposing side of the mold 14 such that the electrical interconnects 12 extend all of the way through the mold 14.

In some example embodiments, [110] filling a mold 11 with an electric conductor to form a number of electrical interconnects 12 within the mold 11 may include filling the mold 11 with copper. The type of electrical conductor that is used to fill the openings in the mold 11 to form the electrical interconnects 12 may depend in part on a variety of manufacturing and design considerations that are associated with fabricating the electronic package 10.

Figure 5:
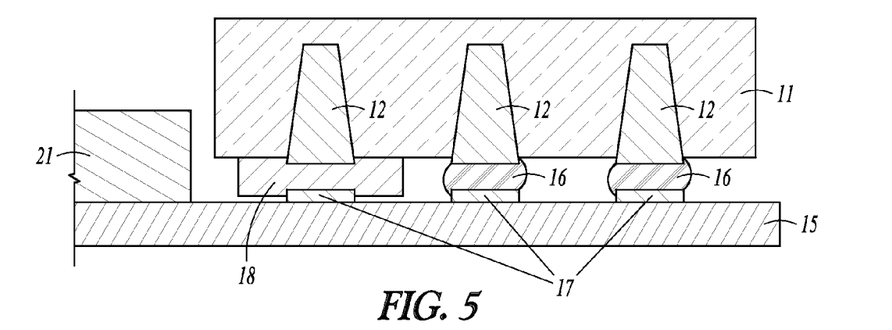
FIG. 5 shows the mold of FIG. 2 attached to a substrate.

As shown in FIG. 1, the method [100] of fabricating an electronic package 10 further includes [120] attaching the mold 11 to a substrate 15 such that the electrical interconnects 12 engage electrical contacts 16 on the substrate 15. FIG. 5 shows the mold 11 of FIG. 2 attached to the substrate 15.

In the example shown in FIG. 5, attaching the mold 11 to the substrate 15 such that electrical interconnects 12 engage electrical contacts 17 on the substrate 15 may include attaching the mold 11 to the substrate 15 with a solder paste 16. As an example, attaching the mold 11 to the substrate 15 with a solder paste 16 may include attaching the solder paste 16 to conductive pads 17 on the substrate 15.

The manner in which the mold 11 is attached to the substrate 15 may vary depending in part on a variety of manufacturing and design considerations that are associated with fabricating the electronic package 10. As examples, the mold 11 may be attached to the substrate 15 using a silver epoxy or anisotropic conductive film (see, e.g. ACF 18 in FIG. 5).

In addition, it is contemplated that the mold 11 may be attached to something on the substrate 15 besides conductive pads 17. The type of electrical connection on the substrate 15 may depend on a variety of manufacturing and design considerations that are associated with fabricating the electronic package 10.

Figure 6:
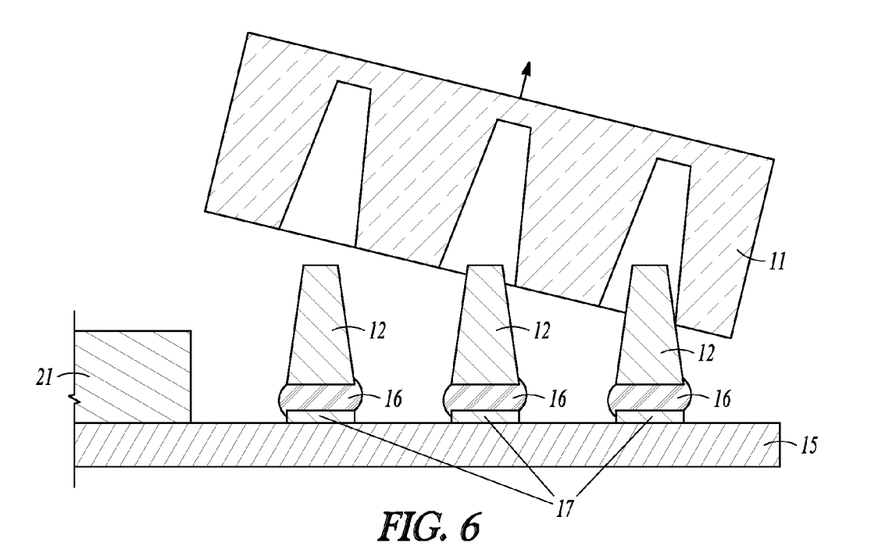
FIG. 6 shows the mold of FIG. 5 being removed from the substrate.

As shown in FIG. 1, the method [100] of fabricating an electronic package 10 further includes [130] removing the mold 11 from the electrical interconnects 12. FIG. 6 shows the mold 11 of FIG. 5 being removed from the substrate 15. The manner in which the mold 11 is removed from the substrate 15 may vary depending in part on a variety of manufacturing and design considerations that are associated with fabricating the electronic package 10.

Figure 7:
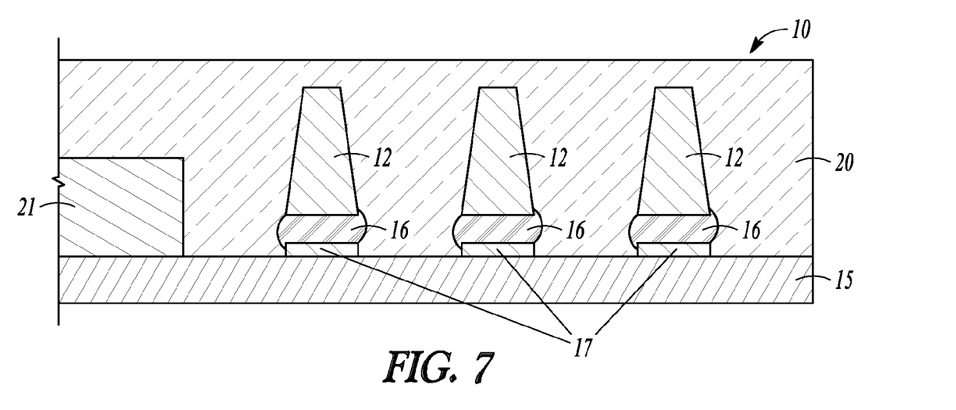
FIG. 7 shows the electrical interconnects of FIG. 6 covered with an electrical insulator.

As shown in FIG. 1, the method [100] of fabricating an electronic package 10 further includes [140] covering the electrical interconnects 12 with an electrical insulator 20. FIG. 7 shows the electrical interconnects 12 covered with an electrical insulator 20.

Figure 8:
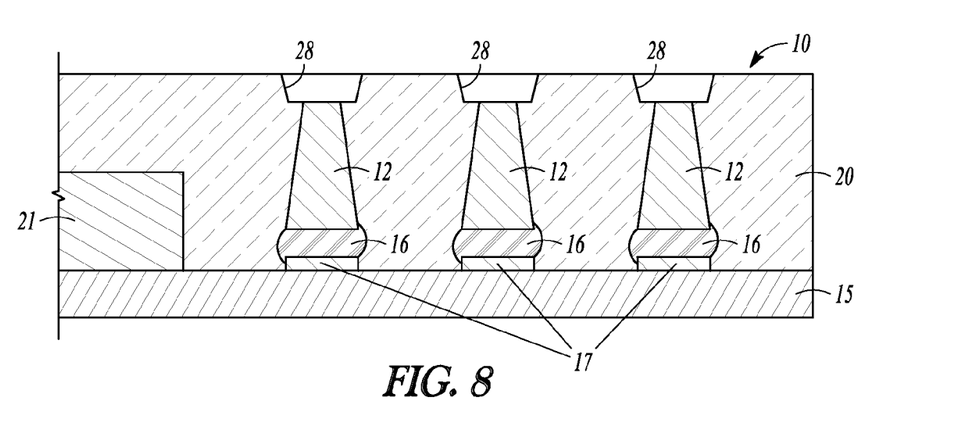
FIG. 8 shows portions of the electrical insulator of FIG. 7 removed to expose the electrical interconnects.

In some forms of the method [100], [140] covering the electrical interconnects 12 with an electrical insulator 20 may include removing portions 28 of the electrical insulator 20 to expose the electrical interconnects 12. FIG. 8 shows the portions 28 of the electrical insulator 20 removed to expose the electrical interconnects.

As an example, the portion of the electrical insulator 20 may be removed to expose the electrical interconnects 12 via etching or some other process. The type of process that is utilized to remove the portion of the electrical insulator 20 will on a variety of manufacturing and design considerations that are associated with fabrication of the electronic package 10.

Figure 9:
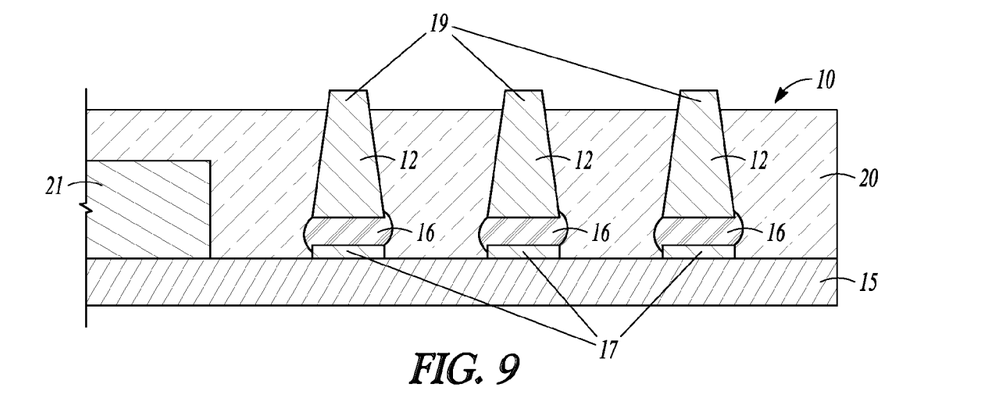
FIG. 9 shows the electrical insulator of FIG. 7 where the electrical interconnects includes sections that exposed from the electrical insulator.

In other forms of the method [100], [140] covering the electrical interconnects 12 with an electrical insulator 20 may include covering the electrical interconnects 12 with an electrical insulator 20 such that sections 19 of the electrical interconnects 12 remain exposed. FIG. 9 shows the electrical insulator 20 of FIG. 7 where the electrical interconnects 12 include sections 19 that are exposed from the electrical insulator 20.

Figure 10:
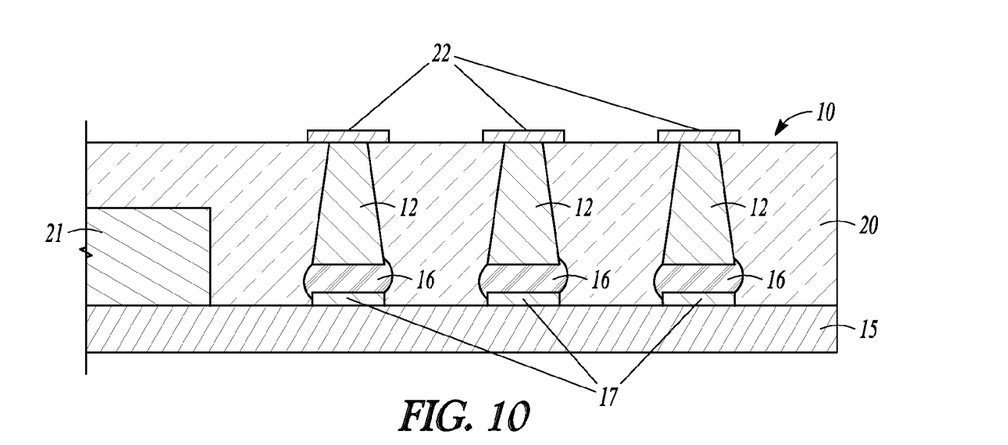
FIG. 10 shows the electrical insulator of FIG. 9 where conductive pads are formed on the electrical insulator.

The method [100] of fabricating an electronic package 10 may further include [150] forming conductive pads 22 on the electrical insulator 20 that engage the electrical interconnects 12. FIG. 10 shows the electrical insulator 20 of FIG. 9 where conductive pads 22 are formed on the electrical insulator 20.

In addition, it is contemplated that something besides conductive pads 17 may be formed on the electrical insulator 20. The type of electrical connection on the electrical insulator 20 may depend on a variety of manufacturing and design considerations that are associated with fabricating the electronic package 10.

The method [100] of fabricating an electronic package 10 may further include [160] attaching a die 21 to the substrate 15 such that the die 21 is electrically connected to at least some of the electrical interconnects 12. FIGS. 5-10 show a die 21 attached to the substrate 15.

The die 21 may be attached to the substrate 15 in any known manner and at any time during the method [100]. As an example, the die 21 may be attached to the substrate 15 before the mold 11 is attached to the substrate 15. In addition, the type, size and arrangement of the die 21 that is attached to the substrate 15 may depend in part on manufacturing and design considerations that are associated with performance and fabrication of the electronic package 10. It should be noted that die 21 may also be in the form multiple dice placed one on top of another and/or positioned adjacent to one another.

Figure 11:
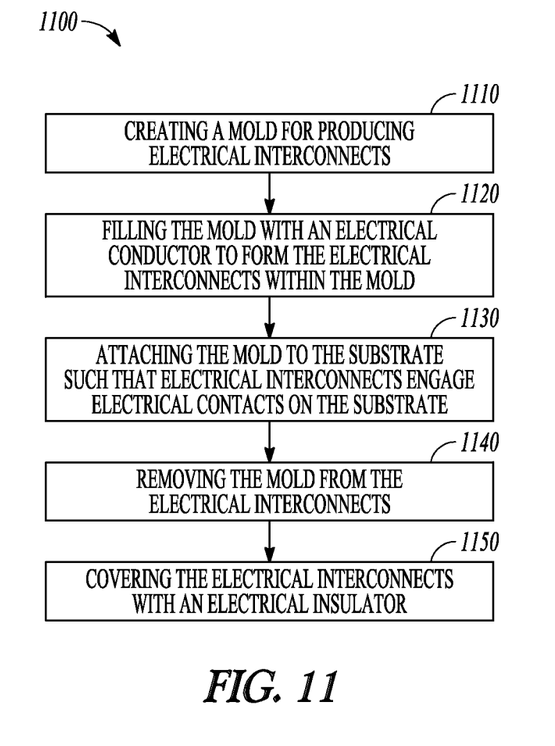
FIG. 11 illustrates a flow diagram of another example method of fabricating an electronic package.

FIG. 11 illustrates another example method [1100] of fabricating an electronic package 10. The method [1100] includes [1110] creating a mold 11 (e.g., a glass mold) for producing electrical interconnects 12; [1120] filling the mold 11 with an electrical conductor to form the electrical interconnects 12 within the mold 11 (see, e.g., FIGS. 2-4); and [1130] attaching the mold 11 to the substrate 15 such that electrical interconnects 12 engage electrical contacts on the substrate 15 (see, e.g., FIG. 5).

The method [1100] may further include [1140] removing the mold 11 from the electrical interconnects 12 (see, e.g., FIG. 6) and [1150] covering the electrical interconnects 12 with an electrical insulator 20 (see, e.g., FIG. 7).

In some forms of the method [1110] creating a mold 11 for producing electrical interconnects 12 may include forming holes in the mold 11 that receive the electrical conductors that form the electrical interconnects 12. As examples, forming holes in the mold 11 that receive the electrical conductors may include forming holes in the mold 11 that extend partially through the mold 11 (see, e.g., FIG. 2), or entirely through the mold 11 from one side of the mold 11 to an opposing side of the mold 11 (see, e.g., FIG. 4).

Figure 12:
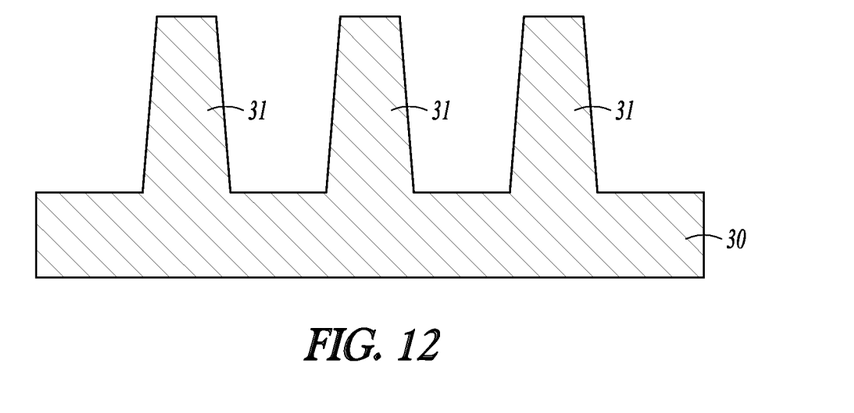
FIG. 12 shows an example model that may be used to form the mold shown in FIG. 2.
Figure 13:
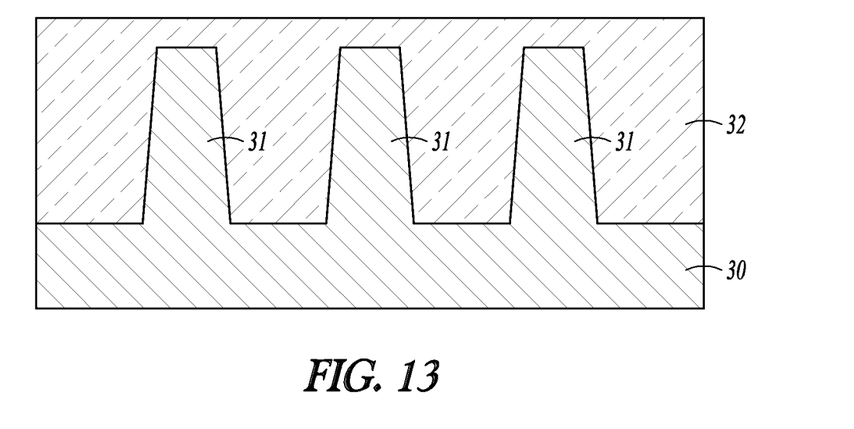
FIG. 13 shows the example model of FIG. 12 covered with a material.

In some forms of the method [1110] creating a mold 11 for producing electrical interconnects 12 may include covering a model 30 that includes electrical interconnect-shaped projections 31 with a material 32 (e.g., polydimethylsiloxane). FIG. 12 shows an example model 30 that may be used to form the mold 11 shown in FIG. 2. FIG. 13 shows the example model 30 of FIG. 12 covered with the material 32. The composition of the model 30 and the material 32 may vary depending in part on a variety of manufacturing and design considerations that are associated with fabricating the mold 11.

Figure 14:
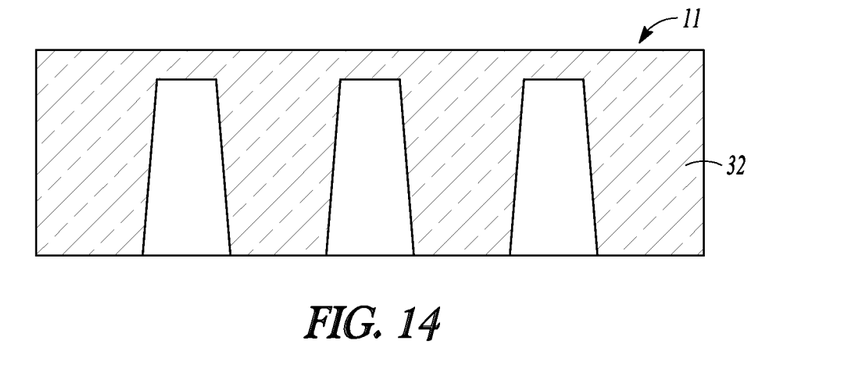
FIG. 14 shows the example material of FIG. 13 after the material has removed from the model of FIG. 12 to form the mold illustrated in FIG. 2.

In addition, [1110] creating a mold 11 for producing electrical interconnects 12 may further include removing the material 32 from the model 30 such that material 32 forms the mold 11 when it is removed from the model 30. FIG. 14 shows the example material 31 after the material 32 has been removed from the model 30 to form the mold 11.

Figure 15:
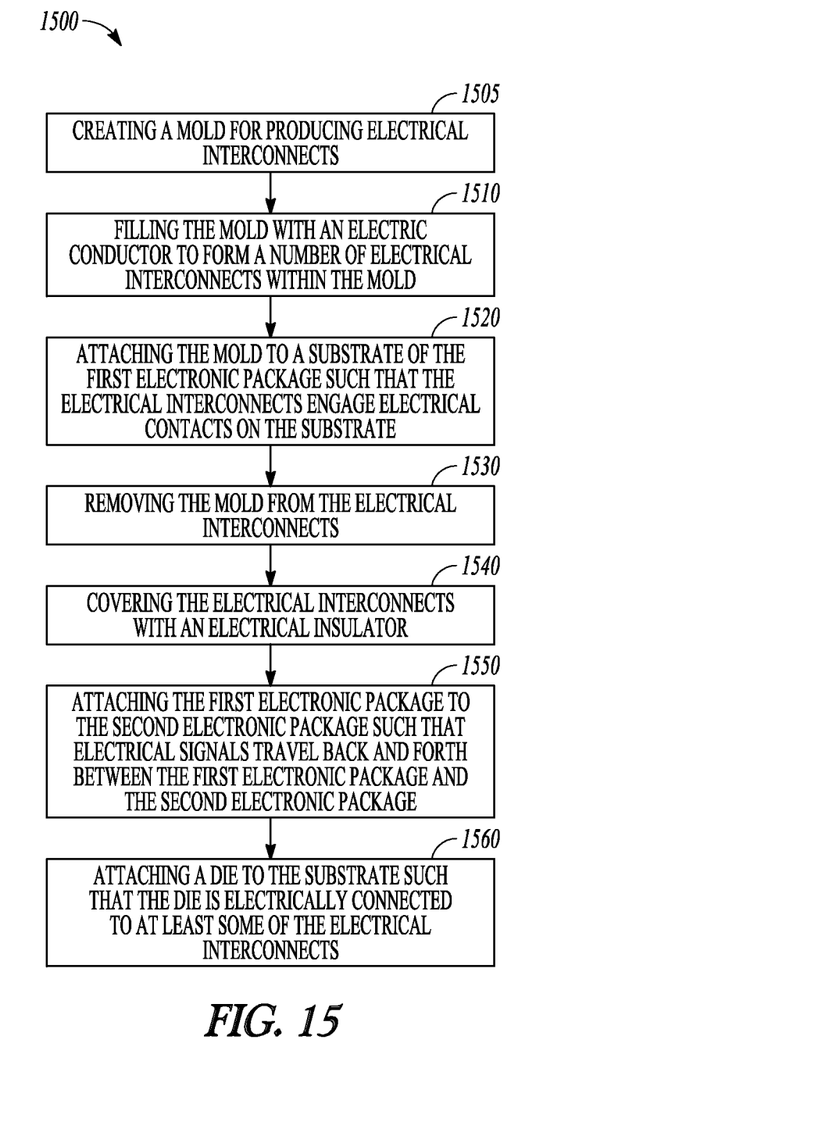
FIG. 15 illustrates a flow diagram of another example method of connecting a first electronic package to a second electronic package.

FIG. 15 illustrates a method [1500] of connecting a first electronic package 10A to a second electronic package 10B. The method [1500] includes [1510] filling a mold 11 with an electric conductor to form a number of electrical interconnects 12 within the mold 11 (see FIGS. 2-4); [1520] attaching the mold 11 to a substrate 15 of the first electronic package 10A such that the electrical interconnects 12 engage electrical contacts on the substrate 15 (see FIG. 5); [1530] removing the mold 11 from the electrical interconnects 12 (see FIGS. 6); and [1540] covering the electrical interconnects 12 with an electrical insulator 20 to form the first electronic package 10A (see FIG. 7).

The method [1500] of connecting a first electronic package 10A to a second electronic package 10B further includes [1550] attaching the first electronic package 10A to the second electronic package 10B such that electrical signals travel back and forth between the first electronic package 10A and the second electronic package 10B through the electrical interconnects 12.

Figure 16:
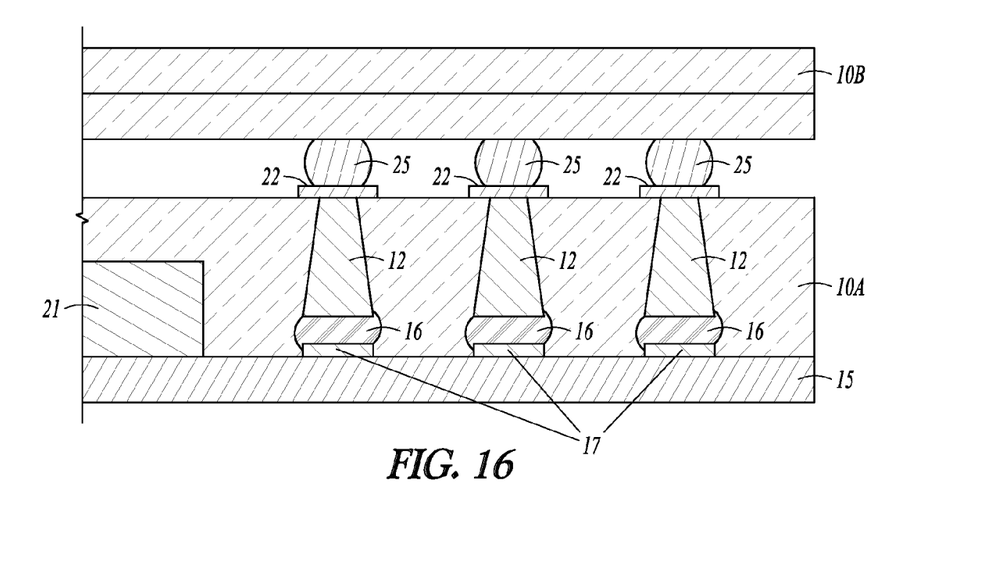
FIG. 16 shows an example form of a first electronic package being attached to the second electronic package.

FIG. 16 shows an example form of the first electronic package 10A being attached to the second electronic package 10B. The first electronic package 10A includes conductive pads 22 (see e.g., FIG. 10) that are secured to the second conductive package 10B using solder balls 25.

Figure 17:
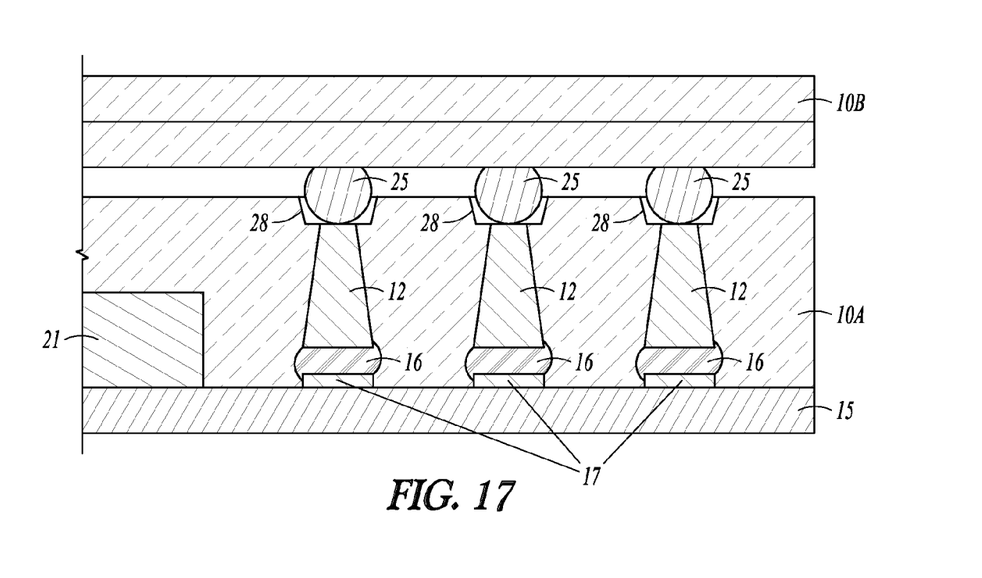
FIG. 17 shows another example form of a first electronic package being attached to the second electronic package.

FIG. 17 shows another example form of the first electronic package 10A being attached to the second electronic package 10B. The first electronic package 10A has portions 28 (see e.g., FIG. 8) of the electrical insulator 20 that are etched out in order to expose the electrical interconnects 12.

The method [1500] of connecting a first electronic package 10A to a second electronic package 10B may further include [1560] attaching a die 21 to the substrate 15 such that the die 21 is electrically connected to at least some of the electrical interconnects 12. FIGS. 16 and 17 show a die 21 attached to the substrate 15 of the first electronic package 10A.

The method [1500] of connecting a first electronic package 10A to a second electronic package 10B may further include [1505] creating the mold 11 (see, e.g., mold 11 in FIG. 14) for producing the electrical interconnects 12 by [1510] filling the mold 11 with an electric conductor to form a number of electrical interconnects 12 within the mold 11 (see, e.g., FIGS. 2-4).

This overview is intended to provide non-limiting examples of the present subject matter—it is not intended to provide an exclusive or exhaustive explanation. The detailed description is included to provide further information about the methods.

To better illustrate the method and apparatuses disclosed herein, a non-limiting list of embodiments is provided here:

Example 1 includes a method of fabricating an electronic package. The method includes filling a mold with an electric conductor to form a number of electrical interconnects within the mold. The mold includes openings that are filled with several electric conductors to form a number of electrical interconnects. The method of fabricating an electronic package further includes attaching the mold to a substrate such that the electrical interconnects engage electrical contacts on the substrate.

Example 2 includes the method of claim 1, wherein filling a mold with the electrical conductor to form a number of electrical interconnects within the mold includes filling the mold with copper.

Example 3 includes the method of any one of examples 1-2, wherein attaching the mold to the substrate such that electrical interconnects engage electrical contacts on the substrate includes attaching the mold to the substrate with a solder paste.

Example 4 includes the method of any one of examples 1-3, wherein attaching the mold to the substrate with a solder paste includes attaching the solder paste to conductive pads on the substrate.

Example 5 includes the method of any one of examples 1-4, wherein covering the electrical interconnects with an electrical insulator includes leaving a portion of the electrical interconnects exposed from the electrical insulator.

Example 6 includes the method of any one of examples 1-5, wherein covering the electrical interconnects with an electrical insulator includes removing portions of the electrical insulator to expose the electrical interconnects.

Example 7 includes the method of any one of examples 1-6, wherein removing portions of the electrical insulator to expose the electrical interconnects includes etching the electrical insulator to expose the electrical interconnects.

Example 8 includes the method of any one of examples 1-7, wherein filling a mold with a conductive liquid to form a number of electrical interconnects within the mold includes filling the mold such that the electrical conductor extends from one side of the mold to an opposing side of the mold.

Example 9 includes the method of any one of examples 1-8, further comprising forming conductive pads on the electrical insulator that engage the electrical interconnects.

Example 10 includes the method of any one of examples 1-9, and further including attaching a die to the substrate that is electrically connected to at least some of the electrical interconnects.

Example 11 includes a method of fabricating an electronic package. The method includes creating a mold for producing electrical interconnects and filling the mold with an electrical conductor to form the electrical interconnects within the mold. The method further includes attaching the mold to the substrate such that electrical interconnects engage electrical contacts on the substrate.

Example 12 includes the method of examples 11, and further including removing the mold from the electrical interconnects and covering the electrical interconnects with an electrical insulator.

Example 13 includes method of any one of examples 11-12, wherein creating a mold for producing electrical interconnects includes forming holes in the mold that receive the electrical conductor.

Example 14 includes the method of any one of examples 11-13, wherein forming holes in the mold that receive the electrical conductor includes forming holes in the mold that extend from one side of the mold to an opposing side of the mold.

Example 15 includes the method of any one of examples 11-14, wherein creating a mold for producing electrical interconnects comprises covering a model that includes electrical interconnect-shaped projections with a material and removing the material from the model to form the mold.

Example 16 includes the method of any one of examples 11-15, wherein covering a model that includes electrical interconnect-shaped projections with a material includes covering the model with polydimethylsiloxane.

Example 17 includes the method of any one of examples 11-16, wherein creating a mold for producing electrical interconnects includes creating a glass mold for producing electrical interconnects.

Example 18 includes a connecting a first electronic package to a second electronic package. The method includes filling a mold with an electrical conductor to form a number of electrical interconnects within the mold and attaching the mold to a substrate of the first electronic package such that electrical interconnects engage electrical contacts on the substrate. The method further includes removing the mold from the electrical interconnects and covering the electrical interconnects with an electrical insulator to form the first electronic package. The method further includes attaching the first electronic package to the second electronic package such that electrical signals travel back and forth between the first electronic package and the second electronic package through the electrical interconnects.

Example 19 includes the method of example 18, and further including creating the mold for producing the electrical interconnects.

Example 20 includes the method of any one of examples 18-19, and further including attaching a die to the substrate of the first electronic package such that the die is electrically connected to at least some of the electrical interconnects.

These and other examples and features of the present electronic device, solder compositions, and related methods will be set forth in part in the detailed description. This overview is intended to provide non-limiting examples of the present subject matter—it is not intended to provide an exclusive or exhaustive explanation. The detailed description is included to provide further information about the systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method, comprising:
   filling a mold with an electric conductor to form a number of electrical interconnects within the mold;
   attaching the mold to a substrate such that the electrical interconnects engage electrical contacts on the substrate;
   removing the mold from the electrical interconnects; and
   covering the electrical interconnects with an electrical insulator.

2. The method of claim 1, wherein filling a mold with the electrical conductor to form a number of electrical interconnects within the mold includes filling the mold with copper.

3. The method of claim 1, wherein attaching the mold to the substrate such that electrical interconnects engage electrical contacts on the substrate includes attaching the mold to the substrate with a solder paste.

4. The method of claim 3, wherein attaching the mold to the substrate with a solder paste includes attaching the solder paste to conductive pads on the substrate.

5. The method of claim 1, wherein covering the electrical interconnects with an electrical insulator includes leaving a portion of the electrical interconnects exposed from the electrical insulator.

6. The method of claim 1, wherein covering the electrical interconnects with an electrical insulator includes removing portions of the electrical insulator to expose the electrical interconnects.

7. The method of claim 6, wherein removing portions of the electrical insulator to expose the electrical interconnects includes etching the electrical insulator to expose the electrical interconnects.

8. The method of claim 1, wherein filling a mold with a conductive liquid to form a number of electrical interconnects within the mold includes filling the mold such that the electrical conductor extends from one side of the mold to an opposing side of the mold.

9. The method of claim 1, further comprising forming conductive pads on the electrical insulator that engage the electrical interconnects.

10. The method of claim 1, further comprising attaching a die directly on to the substrate that is electrically connected to at least some of the electrical interconnects.

11. A method, comprising:
    creating a mold for producing electrical interconnects;
    filling the mold with an electrical conductor to form the electrical interconnects within the mold; and
    attaching the mold to the substrate such that electrical interconnects engage electrical contacts on the substrate.

12. The method of claim 11 further comprising:
    removing the mold from the electrical interconnects; and
    covering the electrical interconnects with an electrical insulator.

13. The method of claim 11, wherein creating a mold for producing electrical interconnects includes forming holes in the mold that receive the electrical conductor.

14. The method of claim 13, wherein forming holes in the mold that receive the electrical conductor includes forming holes in the mold that extend from one side of the mold to an opposing side of the mold.

15. The method of claim 11, wherein creating a mold for producing electrical interconnects comprises:
    covering a model that includes electrical interconnect-shaped projections with a material; and
    removing the material from the model to form the mold.

16. The method of claim 15, wherein covering a model that includes electrical interconnect-shaped projections with a material includes covering the model with polydimethylsiloxane.

17. The method of claim 11, wherein creating a mold for producing electrical interconnects includes creating a glass mold for producing electrical interconnects.

18. A method of connecting a first electronic package to a second electronic package, comprising:
    filling a mold with an electrical conductor to form a number of electrical interconnects within the mold;
    attaching the mold to a substrate of the first electronic package such that electrical interconnects engage electrical contacts on the substrate;
    removing the mold from the electrical interconnects;
    covering the electrical interconnects with an electrical insulator to form the first electronic package;
    attaching the first electronic package to the second electronic package such that the electrical interconnects are able to transmit electrical signals back and forth between the first electronic package and the second electronic package.

19. The method of claim 18, further comprising creating the mold for producing the electrical interconnects.

20. The method of claim 18, further comprising attaching a die to the substrate of the first electronic package such that the die is electrically connected to at least some of the electrical interconnects.

* * * * *